(12) United States Patent
Seo et al.

(10) Patent No.: US 6,489,638 B2
(45) Date of Patent: Dec. 3, 2002

(54) LIGHT EMITTING DEVICE

(75) Inventors: Satoshi Seo, Kanagawa; Shunpei Yamazaki, Tokyo, both of (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/885,469

(22) Filed: Jun. 20, 2001

(65) Prior Publication Data

US 2002/0043663 A1 Apr. 18, 2002

(30) Foreign Application Priority Data

Jun. 23, 2000 (JP) .................................... 2000-190333

(51) Int. Cl.[7] ............................................. H01L 33/00
(52) U.S. Cl. ...................................................... 257/98
(58) Field of Search ................................... 257/98, 79

(56) References Cited

U.S. PATENT DOCUMENTS

| 5,294,810 A | | 3/1994 | Egusa et al. ................ 257/40 |
| 6,358,631 B1 | * | 3/2002 | Forrest et al. .............. 428/690 |
| 2002/0034656 A1 | * | 3/2002 | Thompson et al. .......... 428/690 |
| 2002/0049190 A1 | * | 4/2002 | Bridge et al. ............... 514/188 |

FOREIGN PATENT DOCUMENTS

| EP | 0 390 551 | 7/1996 |
| JP | 2-261889 | 10/1990 |
| JP | 3-115486 | 5/1991 |
| JP | 3-230583 | 10/1991 |
| JP | 3-230584 | 10/1991 |
| JP | 10-148853 | 6/1998 |

OTHER PUBLICATIONS

U.S. Patent Application No. 10/107,631 to Seo, filed Mar. 27, 2002, including specification, abstract, claims, drawings and PTO filing receipt.

Tanaka, M. et al, "Binuclear Metal Complexes. XV.[1)] Copper(II) and Nickel (II) Complexes of Binucleating Ligands Derived from 3–Formyl–Salicylic Acid and Diamines[2)]," Bulletin of the Chemical Society of Japan, vol. 49 No. 9, pp. 2469–2473, Sep. 1976.

Tsutsui, T., et al, "Electroluminescene in Organic Thin Films," Photochemical Processes in Organized Molecular Systems, pp. 437–450, 1991.

Hamada, Y. et al, "Blue Electroluminescence in Thin Films of Azomethin–Zinc Complexes," Jpn. J. Appl. Phys., vol. 32, part 2, No. 4A, pp. L511–L513, Apr., 1993.

Baldo, M.A. et al, "Highly Efficient Phosphorescent Emission from Organic Electroluminescent Devices," Nature, vol. 395, pp. 151–154, Sep. 10, 1998.

(List continued on next page.)

Primary Examiner—Olik Chaudhuri
Assistant Examiner—William C Vesperman
(74) Attorney, Agent, or Firm—Cook, Alex, McFarron, Manzo, Cummings & Mehler, Ltd.

(57) ABSTRACT

There is provided a light emitting device which emits bright light, has low power consumption, and is inexpensive. An organic compound (polynuclear complex) with a molecular structure which is apt to generate a spin-orbit interaction is used for a light emitting layer or a dopant pigment of an EL element, so that a light emitting device in which an energy from a triplet excitation state can be converted into light emission is obtained. At this time, a center metal of the polynuclear complex is made an inexpensive metal (for example, Cu, Ni, Co, V, Mn, Fe, Zn, etc.), so that a manufacturing cost is reduced.

2 Claims, 11 Drawing Sheets

OTHER PUBLICATIONS

Baldo, M.A. et al, "Very High–Efficiency Green Organic Light–Emitting Devices Based on Electrophosphorescence," Applied Physics Letters, vol. 75, No. 1, pp. 4–6, Jul. 5, 1999.

Tsutsui, T. et al, "High Quantum Efficiency in Organic Light–Emitting Devices with Iridium–Complex as a Triplet Emissive Center," Japanese Journal of Applied Physics, vol. 38, part 2, No. 12B, pp. L 1502–L 1504, Dec. 15, 1999.

English abstract re Japanese Patent Application No. JP 2–261889, published Oct. 24, 1990.

English abstract re Japanese Patent Application No. JP 3–115486, published May 16, 1991.

English abstract re Japanese Patent Application No. JP 3–230583, published Oct. 14, 1991.

English abstract re Japanese Patent Application No JP 3–230584, published Oct. 14, 1991.

English abstract re Japanese Patent Application No. JP–148853, published Jun. 2, 1998.

* cited by examiner

LIGHT EMITTING DEVICE

BACKGROUND OF THE INVENTION

1. Field of the Invention

The present invention relates to a light emitting device including an element (hereinafter referred to as an EL element) including a thin film (hereinafter referred to as an organic EL film) which is made of an organic compound to produce EL (Electro Luminescence) and is interposed between electrodes. Particularly, the invention relates to a light emitting device using an organic compound which can convert an energy (hereinafter referred to as a triplet excitation energy) generated in a returning from triplet excitation state to a ground state, into light emission.

2. Description of the Related Art

An EL element using an organic EL film is an element which emits light by applying an electric field, and has attracted attention as an element used for a next generation flat panel display, with characteristics of light weight, low DC voltage driving, high speed response, and the like. Besides, since the element spontaneously emits light and has a wide angle of view, it has been considered to be effective for a display screen of a portable instrument.

In the EL element, an electron injected from a cathode and a hole injected from an anode are recombined at the luminescence center of the organic EL film to form an exciton, and when the exciton returns to the ground state, an energy is radiated to emit light. The excitation state includes a singlet excitation state ($S^*$) and a triplet excitation state ($T^*$), and it has been thought that the statistical generation probability of them is $S^*:T^*=1:3$.

However, since light emission (phosphorescence) from the triplet excitation state ($T^*$) is not observed at room temperature in a general organic compound, it has been considered that a theoretical limiting value of an inner quantum efficiency is 25%. Besides, all the generated light can not be radiated to the outside of the element, but part of the light can not be extracted due to a refractive index which is intrinsic to the element. The ratio of the light extracted to the outside of the element to the generated light is called a light extraction efficiency, and it is said that the extraction efficiency is about 20%.

Accordingly, even if all of injected carriers generate excitons, the ratio (external quantum efficiency) of light which can be finally extracted becomes $25\% \times 20\% = 5\%$ considering the light extraction efficiency. That is, according to the calculation, even if all the carriers are recombined, only 5% can be extracted as light.

However, recently, an organic material in which the triplet excitation energy can be converted into light emission (phosphorescent emission) is proposed, and its high luminous efficiency attracts attention. As examples in which the triplet exciton is used and the external quantum efficiency is improved, there are following reports.

(1) T. Tsutsui, C Adachi, S. Saito, Photochemical Processes in Organized Molecular Systems, ed. K. Honda, (Elsevier Sci. Pub., Tokyo, 1991) p. 437.

(2) M. A. Baldo, D. F. O'Brien, Y. You, A. Shoustikov, S. Sibley, M. E. Thompson, S. R. Forrest, Nature 395 (1988) p. 151.

(3) M. A. Baldo, S. Lamansky, P. E. Burrows, M. E. Thompson, S. R. Forrest, Appl. Phys. Lett., 75 (1999) p.4.

(4) T. Tsutsui, M. -J. Yang, M. Yahiro, K. Nakamura, T. Watanabe, T. Tsuji, Y. Fukuda, T. Wakimoto, S. Mayaguchi, Jpn. Appl. Phys., 38 (12B) (1999) L1502.

Organic materials set forth in the above reports are examples in which the external quantum efficiency is improved by converting the triplet excitation energy into light emission. Among them, there is one which fully exceeds 5% as the theoretical limiting value of the external quantum efficiency described before. For any of the above organic material, a metal complex with platinum, which is a third transition series element, as a center metal (hereinafter referred to as a platinum complex) or a metal complex with iridium as a center material (hereinafter referred to as an iridium complex).

Besides, when a layer made of the iridium complex and a layer made of DCM as a well-known fluorescent pigment are alternately laminated, the triplet excitation energy generated in the iridium complex is transferred to the DCM, and the luminescence center of the DCM is excited so that it is indirectly converted into light emission. Although the light emission of the DCM is light emission (fluorescent emission) from the singlet excitation state, there is a merit that the efficiently generated triplet excitation energy of the iridium complex can be converted to the singlet excitation energy of the DCM.

As described above, the EL element using the organic compound in which the triplet excitation energy can be converted into light emission has a higher external quantum efficiency than that of a conventional one. If the external quantum efficiency is high, light emission brightness is also improved, so that it has been thought that the EL element using the organic compound in which the triplet excitation energy can be converted into light emission has great weight as means for achieving light emission with high brightness in future development.

However, since platinum or iridium is an expensive metal, the metal complexes using those are also expensive, and harmful effects on cost reduction in future is expected. Besides, considering the influence of the metal complex containing a heavy metal upon a human body, a material which is as safe as possible in addition to simplicity of the disposal is desirable as the center metal.

Besides, the luminescent color of the iridium complex is green and the luminescent color of the platinum complex is orange, that is, the both have wavelengths positioned at intermediate places of a visible light region, and red or blue with high color purity has not been obtained. Accordingly, considering the use for a full color flat panel display in future, it is expected that an organic compound becomes necessary; which has a high external quantum efficiency like the iridium complex and the platinum complex and can obtain red light emission and blue light emission with high color purity.

From the above, it can be seen that development of a new organic compound from which phosphorescent can be obtained emission is indispensable in addition to the existing iridium complex and platinum complex.

SUMMARY OF THE INVENTION

An object of the present invention is to provide an organic compound in which a triplet excitation energy can be converted into light emission at a lower cost than the prior art.

Another object of the present invention is to provide an organic compound in which a triplet excitation energy can be converted into light emission at a higher efficiency than the prior art.

Still another object of the present invention is to provide an EL element with a high luminous efficiency by using the organic compound.

Yet another object of the present invention is to provide a light emitting device which has brightness and low power consumption by using an EL element with a high luminous efficiency, which is obtained by carrying out the present invention, and an electric instrument using the same and having low power consumption.

The present inventors have paid attention to a heavy atom effect known in photoluminescence (PL). The heavy atom effect indicates a phenomenon in which a spin-orbit interaction is intensified by a heavy atom (atom comprising a lot of atomic nucleus load) introduced in a molecule of an organic compound or a solvent and phosphorescent emission is accelerated. Incidentally, the atomic nucleus load is equivalent to an atomic number, that is, the number of positive electric charges of an atomic nucleus.

Then, the present inventors have considered that it is necessary that the spin-orbit interaction is intense in order to convert the triplet excitation energy into light emission, and an EL element in which the triplet excitation energy can be converted into light emission can be obtained by intentionally using an organic compound containing a molecular structure to intensify the spin-orbit interaction. That is, the present inventors have considered that even if a heavy atom is not used as a center metal, the triplet excitation energy can be converted into light emission provided that an organic compound containing a molecular structure which can produce the heavy atom effect is used.

In order to intensify the spin-orbit interaction without using the heavy atom, it is possible to cite a method of increasing the total atomic nucleus load by increasing the number of center metals to form a molecular structure substantially containing a heavy atom, a method of forming a molecular structure showing ferromagnetism or antiferromagnetism, and a method of forming a molecular structure using a ferromagnetic metal as a center metal. Particularly, it can be said that to form the molecular structure showing ferromagnetism or antiferromagnetism is preferable since the intensity of the spin-orbit interaction can be adjusted by molecular design.

Then, the present invention is characterized in that, as an organic compound containing a molecular structure to intensify the spin-orbit interaction, a polynuclear complex (metal complex including two or more center metals) which has transition elements as center metals is used for an EL element.

That is, the polynuclear complex using a more inexpensive metal (specifically, a first transition series element) than platinum or iridium is used for a light emitting layer (layer made of an organic compound in which recombination is occurred) of an EL element or a dopant pigment (pigment which is added to a light emitting layer and functions as a luminous center), so that the EL element with a high inner quantum efficiency can be obtained at a lower manufacturing cost than the prior art.

Besides, by using the polynuclear complex, the heavy atom is substantially increased as compared with a conventional mononuclear complex using a heavy atom (platinum or iridium), and as a result, the spin-orbit interaction is intensified, and the inner quantum efficiency of the EL element can also be increased.

By using the polynuclear complex, the same or different metals can be made to exist in one metal complex. That is, a molecular structure which a mononuclear complex can not obtain can also be obtained by a combination of center metals, and the selection width of center metals or ligands of the metal complex which emits phosphorescence is widened.

For example, by introducing nickel as a ferromagnetic metal into a metal complex, such as a metal complex with platinum as a center metal, in which phosphorescent emission is originally obtained, there is a possibility that it becomes easy to obtain light emission from the triplet excitation state. Besides, there is a possibility that a transition probability from the triplet excitation state to the singlet excitation state is increased by the introduction of nickel, and there is a possibility that the luminous efficiency of phosphorescent emission can be made higher than the prior art.

Besides, in the case of the polynuclear complex, an excitation energy state is changed by a combination of center metals. In the triplet excitation by the metal complex, there is a case where the center metal receives the triplet excitation energy generated at the ligand and comes to have the triplet excitation state and phosphorescent light is emitted. Accordingly, the luminous color of the phosphorescent light can be changed by changing the excitation energy state through the combination of the center metals.

Further, in the polynuclear complex, it is also possible to design a metal complex in which center metals are combined through a covalent bond. The present inventors consider that it is possible to cause the heavy atom effect when metals in the metal complex exist in a cluster state.

Besides, the polynuclear complex often has a structure in which ligands form a chelate to surround the center metal, and there is a merit that a three-dimensional molecular structure (stable molecular structure) can be easily obtained. Since such three-dimensional structure (also called a steric hindrance) has an effect of suppressing the interaction between molecules, it is possible to eventually made a complex in which it is hard to cause concentration quenching (phenomenon in which light emission disappears when the concentration becomes high).

As described above, the luminous efficiency of the EL element can be made higher than the prior art by making the molecular design while the polynuclear complex is used for the light emitting layer or the dopant pigment. Besides, the luminous color can also be controlled by the molecular design of the polynuclear complex. Besides, as a result, it is possible to obtain a light emitting device which is inexpensive and has low power consumption.

Incidentally, in the present specification, the light emitting device indicates an image display device or a plane emission device using an EL element as a light emitting element. Besides, the light emitting device includes a module in which a TAB (Tape Automated Bonding) tape or a TCP (Tape Carrier Package) is attached to a substrate over which an EL element is formed, a module in which a printed wiring board is provided at an end of a TAB tape or a TCP, and a module in which an IC (Integrated Circuit) is directly mounted on a substrate over which an EL element is formed by a COG (Chip On Glass) system.

DETAILED DESCRIPTION OF THE PREFERRED EMBODIMENTS

Figure 1:
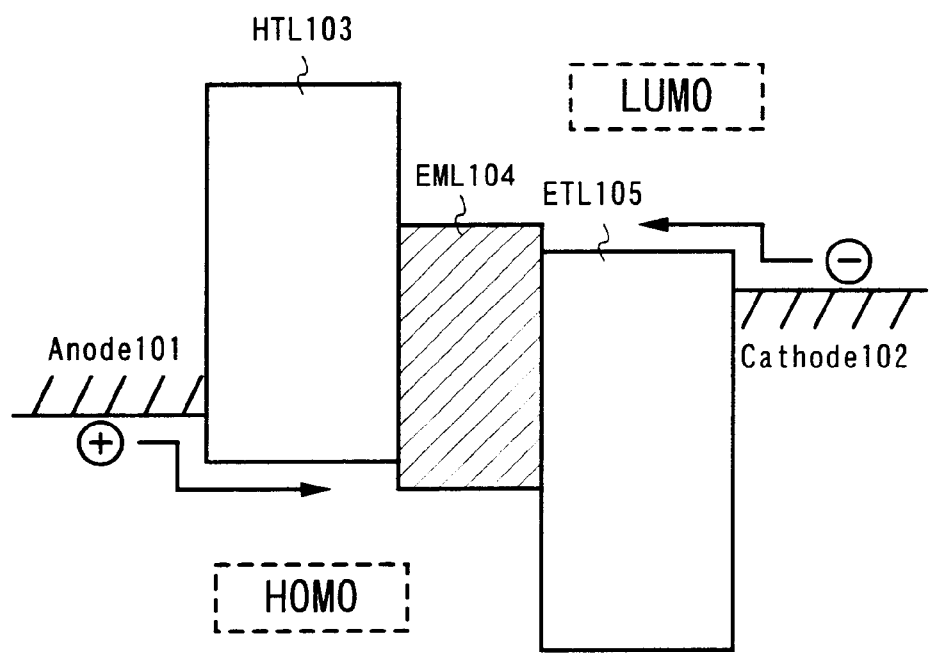
FIG. 1 is a view showing a band diagram of an EL element.

First, a mode for carrying out the invention will be described.

Organic compounds in which a triplet excitation energy can be converted into light emission and which are disclosed in the present invention can be expressed by chemical formulae described below.

The organic compounds expressed by the following chemical formulae (1) to (5) are polynuclear complexes each containing two metal atoms which are same or different (especially a complex on which two metal atoms are contained is also called a dinuclear complex). These have a merit that its synthesis is simple.

Incidentally, a general formula of a metal complex containing two different metal elements as center metals is expressed by the following chemical formula (1), (2) or (3), and a general formula of a metal complex containing two same metal elements as center metals is expressed by the following chemical formula (4) or (5).

Chemical Formula 1

In the organic compound expressed by the above chemical formula (1), R1 and R2 designate hydrogen atoms, alkyl groups or substituents (phenyl groups or aryl groups containing substituents) containing benzene nuclei, and they may be different or same. Besides, A1 and A2 designate chain substituents containing nitrogen, oxygen, carbon or sulfur, or heterocyclic groups containing hetero atoms, and they may be different or same each other. Besides, M1 and M2 designate transition elements, and they may be different or same each other. Incidentally, n is an integer of n=2 or more.

Chemical Formula 2

In the organic compound expressed by the above chemical formula (2), R1 and R2 designate hydrogen atoms, alkyl groups, or substituents containing benzene nuclei, and they may be different or same each other. Besides, A1 to A4 designate chain substituents containing nitrogen, oxygen, carbon or sulfur, or heterocyclic groups containing hetero atoms, and they may be different or same each other. Besides, M1 and M2 designate transition elements, and they may be different or same each other. Incidentally, n is an integer of n=2 or more.

Chemical Formula 3

In the organic compound expressed by the above chemical formula (3), R1 to R4 designate hydrogen atoms, alkyl groups, or substituents containing benzene nuclei, and they may be different or same each other. Incidentally, R1 and R2, or R3 and R4 may be combined with each other to form a ring. Besides, M1 and M2 designate divalent metal atoms or monovalent metal atoms containing a covalent bond, an ionic bond, or a coordinate bond with an element in group 15 to 17 of the periodic table, and they may be different or same each other. Incidentally, n is an integer of n=2 or more.

Chemical Formula 4

In the organic compound expressed by the above chemical formula (4), R1 and R2 designate substituents (substituents especially containing carbonyl groups) in which carbon atoms are combined like a chain or substituents containing benzene nuclei, and they may be different or same each other. Besides, A1 and A2 designate amino groups or heterocyclic groups (typically, heterocyclic groups containing nitrogen, oxygen, or sulfur) containing hetero atoms, and they may be different or same each other. Besides, M denotes a divalent metal atom or a metal atom with at least divalence containing a covalent bond, an ionic bond, or a coordinate bond with an element in group 15 to 17 of the periodic table. Incidentally, n is an integer of n=2 or more.

Chemical Formula 5

In the organic compound expressed by the above chemical formula (5), R1 and R2 designate hydrogen atoms, alkyl groups, or substituents containing benzene nuclei, and they may be different or same each other. Besides, A1 and A2 designate chain substituents containing nitrogen, oxygen, carbon or sulfur or heterocyclic groups containing hetero atoms, and they may be different or same each other. Besides, M designates a transition element. Incidentally, n is an integer of n=2 or more.

Besides, in addition to the above organic compounds, a polynuclear complex containing a covalent bond between center metals can also be used as an organic compound of the present invention.

Incidentally, in the case where the same metals are used as the center metals designated by M1 and M2, Co(II), Ni(II) or Cu(II) may be used. Incidentally, in the organic compound expressed by the chemical formula (4) or (5), the above is true of the center metal designated by M.

Besides, in the case where different metals are used as the center metals designated by M1 and M2, a combination as in the following table is conceivable.

Table 1

The organic compounds of the present invention described above can be made more inexpensive than the prior art by making the center metals inexpensive metals. Besides, in the EL element using the organic compound of the present invention, its luminous efficiency can be made higher than the prior art. Accordingly, the light emitting device of the present invention using the organic compound of the present invention for the EL element can be made a light emitting device which emits bright light and has low power consumption.

(Embodiment 1)

In this embodiment, the polynuclear complex expressed by the chemical formula (1) in the mode for carrying out the invention will be specifically exemplified.

First, an organic compound expressed by a following chemical formula (6) is a dinuclear complex using tetravalent vanadium (V(IV)) and divalent copper (Cu(II)) as center metals, and a ferromagnetic action operates between metal atoms. Besides, since the atomic nucleus load of vanadium is 23 and the atomic nucleus load of copper is 29, the total atomic nucleus load of the organic compound expressed by the chemical formula (6) is equivalent to 52. Accordingly, the action by ferromagnetism can be expected in addition to the heavy atom effect, and therefore it is conceivable that the spin-orbit interaction is intensified and the efficiency of converting the triplet excitation energy into light emission is improved.

Chemical Formula 6

An organic compound expressed by a following chemical formula (7) is a dinuclear complex using divalent manganese (Mn(II)) and divalent cobalt (Co(II)) as center metals. Since the atomic nucleus load of manganese is 25 and the atomic nucleus load of cobalt is 27, the total atomic nucleus load of the organic compound expressed by the chemical formula (7) is equivalent to 52. Therefore, it is conceivable that the heavy atom effect is produced, the spin-orbit interaction is intensified, and the efficiency of converting the triplet excitation energy into light emission is improved.

Chemical Formula 7

(Embodiment 2)

In this embodiment, the polynuclear complex expressed by the chemical formula (2) in the mode for carrying out the invention will be specifically exemplified.

An organic compound expressed by a following chemical formula (8) is a dinuclear complex using divalent iron (Fe(II)) and divalent copper (Cu(II)) as center metals. Since the atomic nucleus load of iron is 26 and the atomic nucleus load of copper is 29, the total atomic nucleus load of the organic compound expressed by the chemical formula (8) is equivalent to 55. Therefore, it is conceivable that the heavy atom effect is produced, the spin-orbit interaction is intensified, and the efficiency of converting the triplet excitation energy into light emission is improved.

Chemical Formula 8

(Embodiment 3)

In this embodiment, the polynuclear complex expressed by the chemical formula (3) in the mode for carrying out the invention will be specifically exemplified.

An organic compound expressed by a following chemical formula (9) is a dinuclear complex using divalent zinc (Zn(II)) and divalent nickel (Ni(II)) as center metals. Since the atomic nucleus load of zinc is 30 and the atomic nucleus load of nickel is 28, the total atomic nucleus load of the organic compound expressed by the chemical formula (9) is equivalent to 58. Therefore, it is conceivable that the heavy atom effect is produced, the spin-orbit interaction is intensified, and the efficiency of converting the triplet excitation energy into light emission is improved.

Chemical Formula 9

(Embodiment 4)

In this embodiment, the polynuclear complex expressed by the chemical formula (4) in the mode for carrying out the invention will be specifically exemplified.

An organic compound expressed by a following chemical formula (10) is a dinuclear complex using two divalent copper (Cu(II)) as center metals, and an antiferromagnetic action operates between the metal atoms. Since the atomic nucleus load of copper is 29, the total atomic nucleus load of the organic compound expressed by the chemical formula (10) is equivalent to 58. Accordingly, it is conceivable that the spin-orbit interaction is intensified by the antiferromagnetism and the heavy atom effect, and the efficiency of converting the triplet excitation energy into light emission is improved.

Chemical Formula 10

(Embodiment 5)

In this embodiment, the polynuclear complex expressed by the chemical formula (5) in the mode for carrying out the invention will be specifically exemplified.

An organic compound expressed by a following chemical formula (11) is a dinuclear complex using two trivalent manganese elements (Mn(III)) as center metals. Since the atomic nucleus load of manganese is 25, the total atomic nucleus load of the organic compound expressed by the chemical formula (11) is equivalent to 50. Therefore, it is conceivable that the heavy atom effect is produced, the spin-orbit interaction is intensified, and the efficiency of converting the triplet excitation energy into light emission is improved.

Chemical Formula 11

(Embodiment 6)

The organic compounds expressed by the chemical formulae (1) to (5) described in the mode for carrying out the invention, and the organic compounds expressed by the chemical formulae (6) to (11) described in the embodiments 1 to 5 can be used for a light emitting layer, a hole transfer layer, an electron transfer layer, or a dopant pigment in an EL element.

In the case where the organic compound of the present invention is a metal complex in which a lowest unoccupied molecular orbital (LUMO) level is low and a highest occupied molecular orbital (HOMO) level is high, that is, a metal complex with a narrow energy gap, it is effective to use the organic compound as a light emitting layer, and light emission in that case is apt to become long wavelength side light. FIG. 1 shows a band diagram in the case where the organic compound of the present invention is used for the light emitting layer. In FIG. 1, reference numeral 101 designates an anode; 102, a cathode; 103, a hole transfer layer (HTL); 104, an emitting layer (EML); and 105, an electron transfer layer (ETL).

Figure 2:
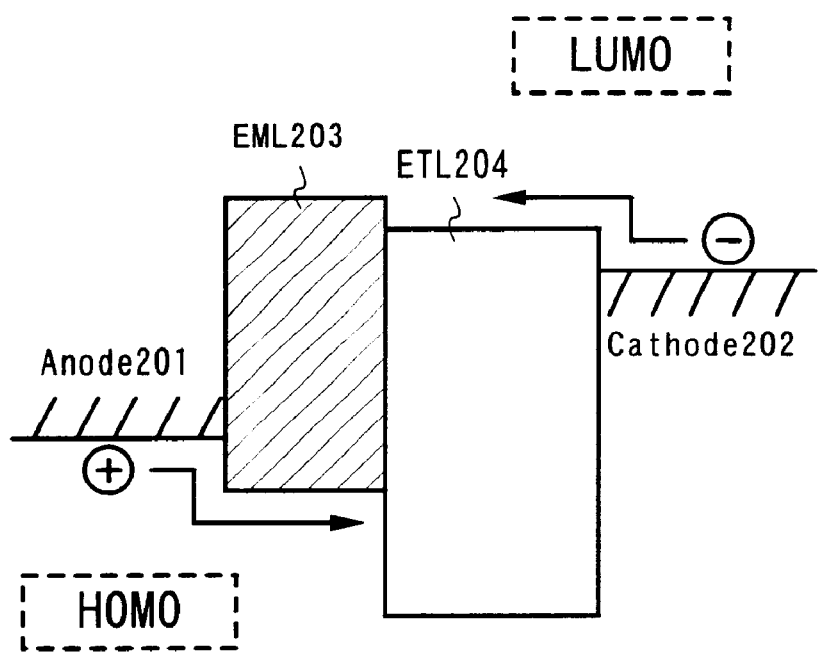
FIG. 2 is a view showing a band diagram of an EL element.

In the case where the organic compound of the present invention has a hole transfer property, it is effective to use the organic compound as a hole transfer emitting layer, and in that case, a recombination probability in the hole transfer emitting layer can be increased when an electron transfer layer with a low HOMO level is used as a hole blocking layer. FIG. 2 shows a band diagram in the case where the organic compound of the present invention is used for the hole transfer emitting layer. In FIG. 2, reference numeral 201 designates an anode: 202, a cathode; 203, a hole transfer emitting layer; and 204, an electron transfer layer.

Figure 3:
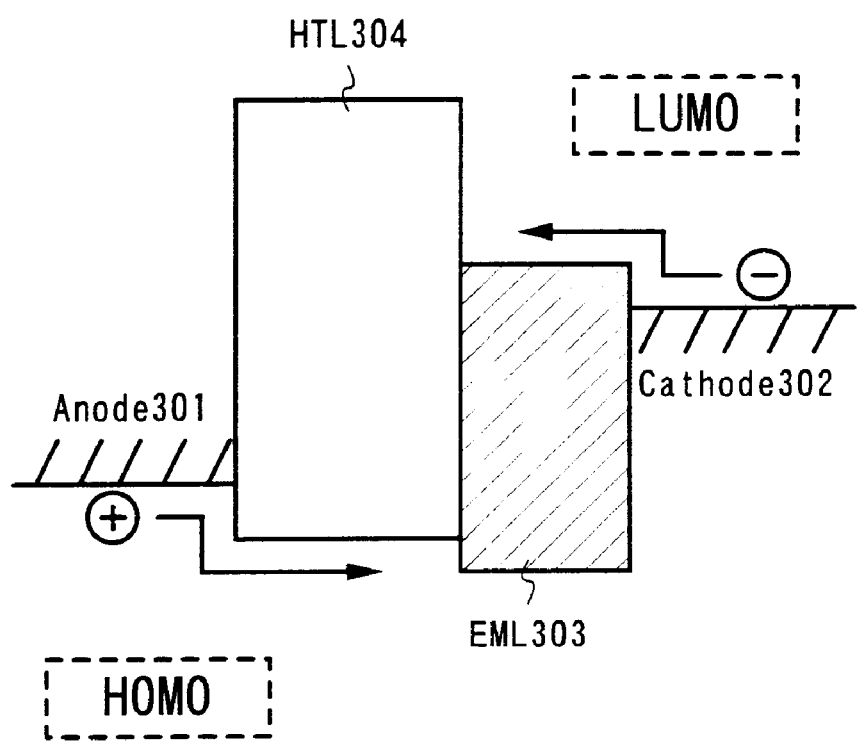
FIG. 3 is a view showing a band diagram of an EL element.

In the case where the organic compound of the present invention has an electron transfer property, it is effective to use the organic compound for an electron transfer emitting layer, and in that case, a recombination probability in the electron transfer emitting layer can be increased when a hole transfer layer with a high LUMO level is used as an electron blocking layer. FIG. 3 shows a band diagram in the case where the organic compound of the present invention is used for the electron transfer emitting layer. In FIG. 3, reference numeral 301 designates an anode; 302, a cathode; 303, an electron transfer emitting layer; and 304, a hole transfer layer.

In the case where the organic compound of the present invention does not have a carrier transfer property, and the HOMO level is higher than the HOMO level of a carrier transfer layer and the LUMO level is lower than the LUMO level of the carrier transfer layer, it is effective to use the organic compound as a dopant pigment. A carrier transfer layer to which the organic compound is added as the dopant pigment may be a hole transfer layer or an electron transfer layer. Besides, the organic compound can also be added to an emitting layer.

Figure 4:
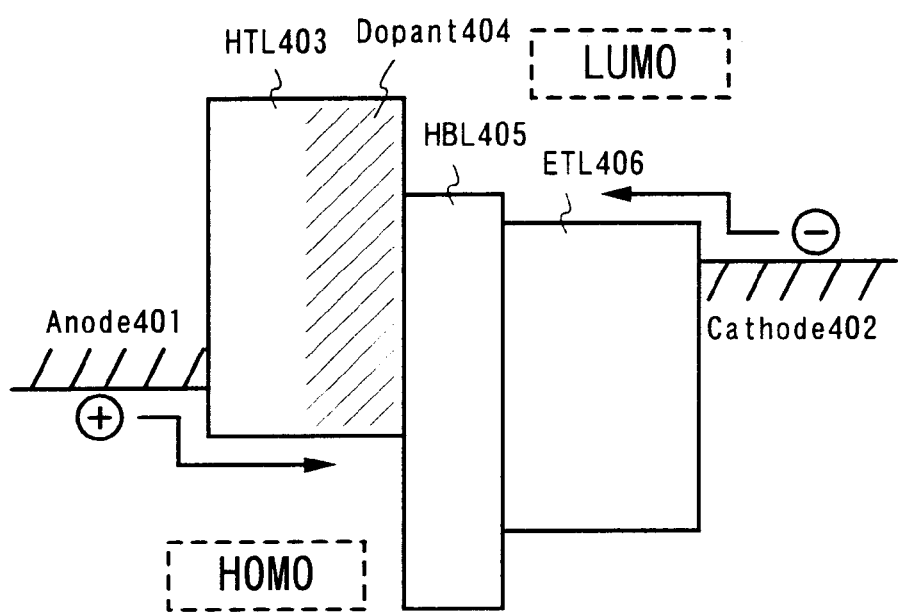
FIG. 4 is a view showing a band diagram of an EL element.

Here, FIG. 4 shows a band diagram in the case where the organic compound of the present invention is added to the hole transfer layer. In FIG. 4, reference numeral 401 designates an anode; 402, a cathode; 403, a hole transfer layer; 404, a dopant pigment (Dopant) added to the inside of the hole transfer layer 403; 405, a hole blocking layer (HBL); and 406, an electron transfer layer.

Incidentally, it is also possible, to make both the hole transfer layer 403 and the electron transfer layer 406 emit light by adding the dopant pigment to the electron transfer layer 406 as well and adjusting the thickness of the hole blocking layer 405.

Incidentally, as the organic compound of the present invention in this embodiment, any one or some of the organic compounds expressed by the foregoing chemical formulae (1) to (5) can be used. Of course, any organic compound shown in the embodiments 1 to 5 may be used.
(Embodiment 7)

Figure 5:
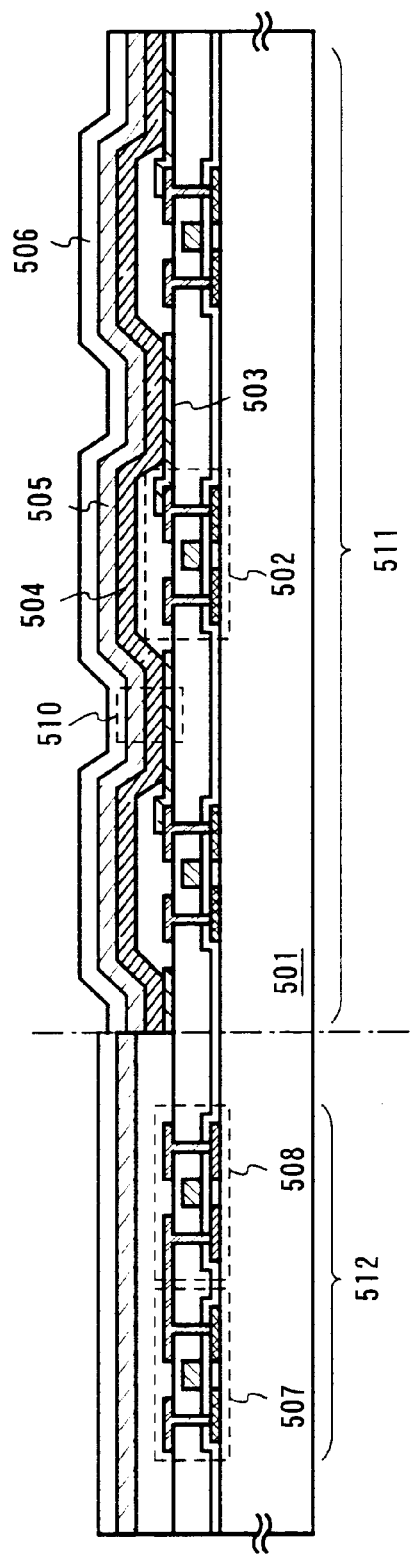
FIG. 5 is a view showing a sectional structure of a light emitting device.

In this embodiment, a light emitting device including an EL element using an organic compound of the present invention will be described. FIG. 5 is a sectional view of an active matrix type light emitting device using the organic compound of the present invention. Incidentally, although a thin film transistor (hereinafter referred to as a TFT) is used here as an active element, a MOS transistor may be used.

Besides, although a top gate TFT (specifically, a planar TFT) is exemplified as a TFT, a bottom gate TFT (typically, a reverse stagger TFT) can also be used.

In FIG. 5, reference numeral 501 designates a substrate, and the substrate transparent to visible light is used here. Specifically, a glass substrate, a quartz substrate, a crystallized glass substrate, or a plastic substrate (including a plastic film) may be used. Incidentally, the substrate 501 also includes an insulating film provided on the surface of the substrate.

A pixel portion 511 and a driving circuit 512 are provided on the substrate 501. Here, first, the pixel portion 511 will be described.

The pixel portion 511 is a region where an image display is carried out, and includes a plurality of pixels. A TFT (hereinafter referred to as a current control TFT) 502 for controlling a current flowing through an EL element and an EL element 510 are provided for each of the pixels. Incidentally, although only the current control TFT 502 is shown here, a TFT (hereinafter referred to as a switching TFT) for controlling a voltage applied to a gate of the current control TFT is provided.

As the current control TFT 502, it is preferable to use a p-channel TFT here. Although an n-channel TFT can also be used, in the case where the current control TFT is connected to an anode of the EL element as in the structure of FIG. 5, the p-channel TFT can suppress power consumption more effectively. However, as the switching TFT (not shown), any of an n-channel TFT and a p-channel TFT may be used.

A pixel electrode 503 is electrically connected to a drain of the current control TFT 502. Here, since a conductive material having a work function of 4.5 to 5.5 eV is used as a material of the pixel electrode 503, the pixel electrode 503 functions as an anode of the EL element 510. As the pixel electrode 503, typically, indium oxide, tin oxide, zinc oxide, or a compound of these may be used.

An EL layer 504 is provided on the pixel electrode 503. In the present specification, the EL layer is a laminate which is made of an organic compound or an inorganic compound and is contained in the structure of the EL element, and generically indicates a laminate layer of a light emitting layer and an organic compound or inorganic compound layer functioning as a hole injection layer, a hole transfer layer, a hole blocking layer, an electron injection layer, an electron transfer layer, or an electron blocking layer. However, the EL layer also includes a case where the light emitting layer is used as a single layer. In this embodiment, the organic compound of the present invention is used for the light emitting layer or a dopant pigment.

Next, a cathode 505 is provided on the EL layer 504. A conductive material having a work function of 2.5 to 3.5 eV is used as a material of the cathode 505. As the cathode 505, typically, a conductive film containing an element in group 1 or group 2 of the periodic table or a laminate of the former and aluminum alloy may be used.

The EL element 510 constituted by the pixel electrode 503, the EL layer 504, and the cathode 505 is covered with a protection film 506. The protection film 506 is provided to protect the EL element 510 against oxygen and water. As a material of the protection film 506, a silicon nitride film, a silicon nitride oxide film, an aluminum oxide film, a tantalum oxide film, or a carbon film (specifically, a diamond-like carbon film) is used.

Next, the driving circuit 512 will be described. The driving circuit 512 is a region where timings of signals (gate signals and data signals) transmitted to the pixel portion 511 are controlled, and a shift register, a buffer, a latch, an analog switch (transfer gate), or a level shifter is provided. Here, a CMOS circuit formed of an n-channel TFT 507 and a p-channel TFT 508 is shown as a basic unit of these circuits.

Incidentally, the circuit structure of the shift register, buffer, latch, analog switch (transfer gate) or level shifter may be a well-known one. In FIG. 5, although the pixel portion 511 and the driving circuit 512 are provided on the same substrate, it is also possible to electrically connect an IC or LSI without providing the driving circuit 512.

Here, although the anode of the EL element 510 is electrically connected to the current control TFT 502, a structure can also be adopted in which a cathode of the EL element is electrically connected to the current control TFT. In that case, it is appropriate that the pixel electrode is formed of the same material as the cathode 505, and the cathode is formed of the same material as the pixel electrode 503. In that case, it is preferable that the current control TFT is made an n-channel TFT.

Figure 6A:
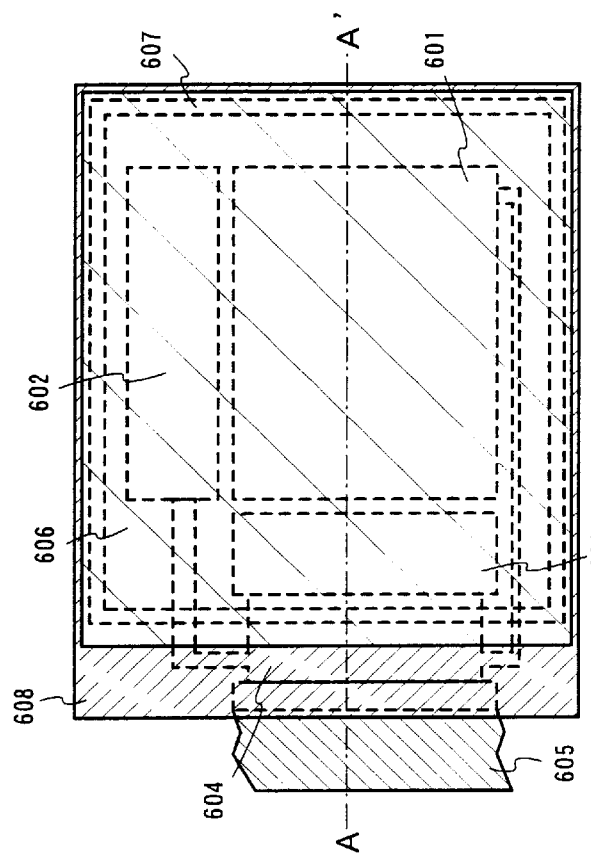
FIGS. 6A and 6B are views showing an upper structure and a sectional structure of a light emitting device.
Figure 6B:
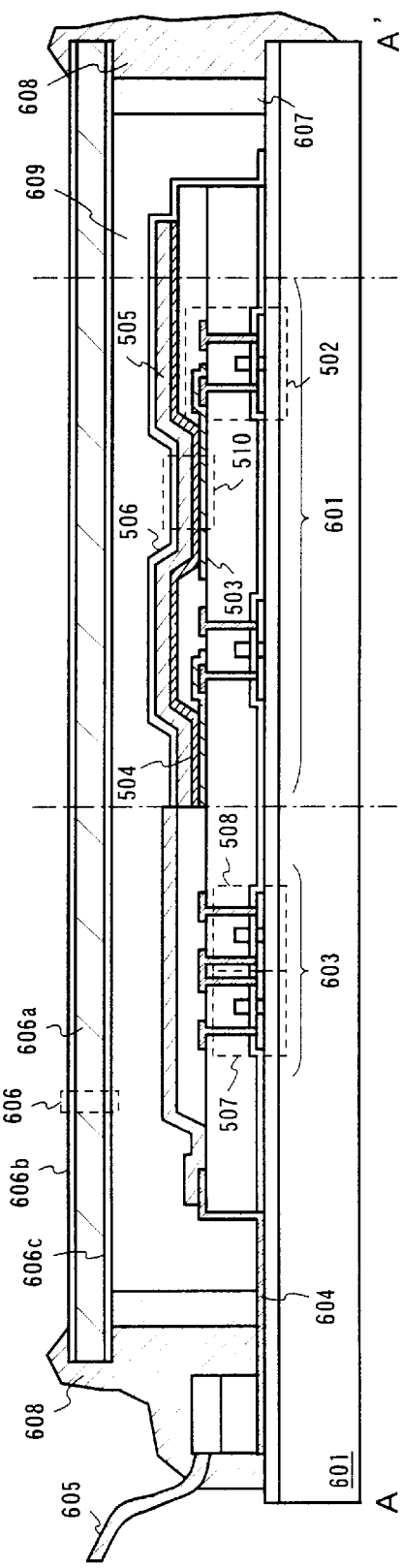

Here, external appearance views of the active matrix type light emitting device shown in FIG. 5 are shown in FIGS. 6A and 6B. FIG. 6A is a top view and FIG. 6B is a sectional view taken along A—A' of FIG. 6A. Besides, symbols of FIG. 5 are used.

In FIG. 6A, reference numeral 601 designates a pixel portion; 602, a gate signal side driving circuit; and 603, a data signal side driving circuit. Signals transmitted to the gate signal side driving circuit 602 and the data signal side driving circuit 603 are inputted through an input wiring line 604 from a TAB (Tape Automated Bonding) tape 605. Incidentally, although not shown, instead of the TAB tape 605, a TCP (Tape Carrier Package) in which an IC (Integrated Circuit) is provided on a TAB tape may be connected.

At this time, reference numeral 606 designates a cover member provided over the EL element 510 shown in FIG. 5, and is bonded through a sealing member 607 made of resin.

As the cover member 606, any material may be used as long as oxygen and water does not permeate through it. Here, as shown in FIG. 6B, the cover member 606 is formed of a plastic member 606a and carbon films (specifically diamond-like carbon films) 606b and 606c provided on the outside surface and the inside surface of the plastic member 606a.

Further, as shown in FIG. 6B, the seal member 607 is covered with a sealing member 608 made of resin, and the EL element 510 is completely sealed in an airtight space 609. At this time, the airtight space 609 may be filled with an inert gas (typically, a nitrogen gas or a rare gas), a resin, or an inert liquid (typically, liquid carbon fluoride typified by perfluoroalkane). Further, it is also effective to provide a moisture absorbent or a deoxidation agent.

Besides, a polarizing plate may be provided on a display surface (surface on which an image is observed) of the light emitting device shown in this embodiment. This polarizing plate has an effect to suppress reflection of light incident from the outside, and to prevent an observer from being reflected on the display surface. In general, a circular polarization plate is used. However, in order to prevent light emitted from the EL layer from being returned to the inside through reflection by the polarizing plate, it is desirable to form a structure having low inner reflection by adjusting refractivity.

Incidentally, for the EL element included in the light emitting device of this embodiment, any of the organic compounds (organic compounds expressed by the chemical formulae (1) to (11)) of the present invention may be used. Besides, it is also possible to combine it with the structure of the embodiment 6.

(Embodiment 8)

Figure 7A:
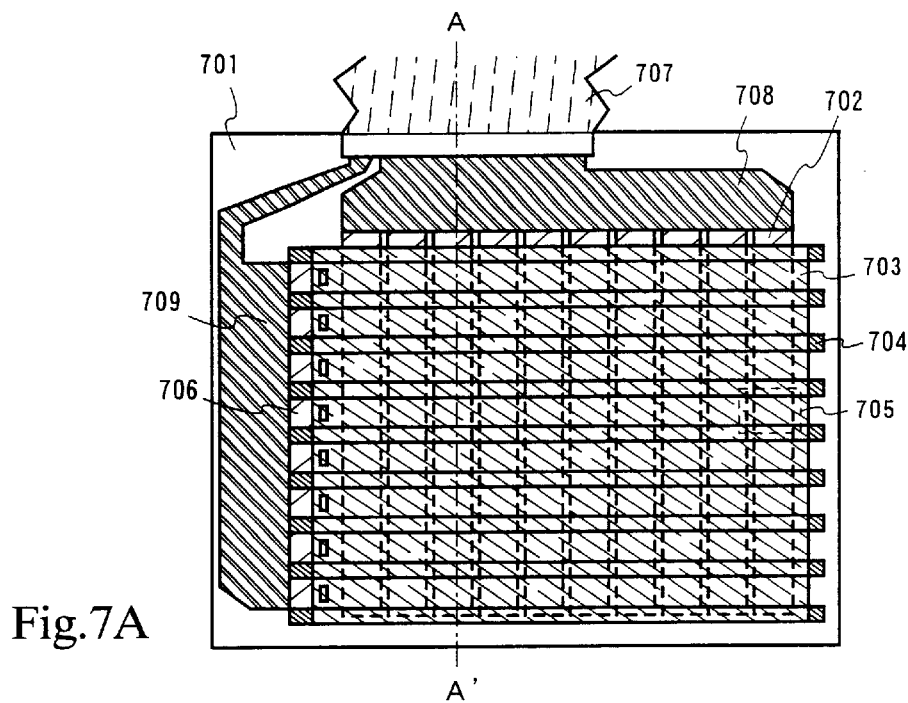
FIGS. 7A to 7C are views showing an upper structure and sectional structures of a light emitting device.
Figure 7B:
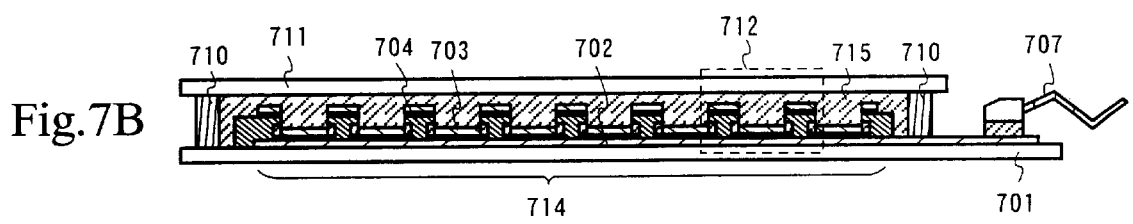
Figure 7C:
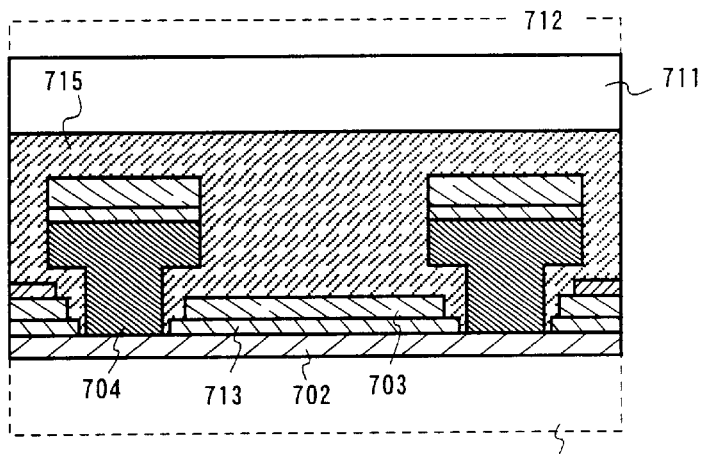

In this embodiment, a light emitting device including an EL element using an organic compound of the present invention will be described. FIGS. 7A to 7C are sectional views of a passive matrix type light emitting device using the organic compound of the present invention.

In FIG. 7A, reference numeral 701 designates a substrate, and here, a plastic material is used. As the plastic material, polyimide, polyamide, acryl resin, epoxy resin, PES (polyethylene sulfile), PC (polycarbonate), PET (polyethylene terephthalate), or PEN (polyethylene naphthalate) is shaped into a plate or a film and is used.

Reference numeral 702 designates a scanning line (anode) made of an oxide conductive film, and in this embodiment, an oxide conductive film of zinc oxide, to which gallium oxide is added, is used. Reference numeral 703 designates a data line (cathode) made of a metal film and a bismuth film is used in this embodiment. Reference numeral 704 designates a bank made of acryl resin, and functions as a partition wall for dividing the data line 703. A plurality of scanning lines 702 and data lines 703 are formed to have a stripe shape, and are provided to intersect with each other at right angles. Although not shown in FIG. 7A, an EL layer is interposed between the scanning line 702 and the data line 703, and an intersection portion designated by 705 becomes a pixel.

The scanning line 702 and the data line 703 are connected to an external driving circuit through a TAB tape 707. Reference numeral 708 designates a wiring group in which the scanning lines 702 are collected, and 709 designates a wiring group made of a collection of connection wiring lines 706 connected to the data lines 703. Although not shown, instead of the TAB tape 707, a TCP in which an IC is provided on a TAB tape may be connected.

Besides, in FIG. 7B, reference numeral 710 designates a seal member; and 711, a cover member bonded to the plastic member 701 by the seal member 710. As the seal member 710, a photo-curing resin may be used, and a material with little degassing and low moisture sorption is desirable. As the cover member, the same material as the substrate 701 is desirable, and glass (including quartz glass) or plastic can be used. Here, a plastic member is used.

A region designated by 712 indicates a structure of a pixel, and FIG. 7C is its enlarged view. Reference numeral 713 designates an EL element, and is formed by suitably combining a hole injection layer, a hole transfer layer, a light emitting layer, an electron transfer layer and an electron injection layer. Of course, the light emitting layer may be used as a single layer. At this time, the organic compound of the present invention may be used for the light emitting layer.

Incidentally, as shown in FIG. 7C, the bank 704 has such a shape that the width of a lower layer is narrower than the width of an upper layer, and physically divides the data line 703.

A pixel portion 714 surrounded by the seal member 710 is cut off from the outer air by a sealing member 715 made of resin and has a structure of preventing deterioration of the EL layer.

Since the pixel portion 714 is formed of the scanning lines 702, the data lines 703, the banks 704, and the EL layers 713, the light emitting device of the present invention including the structure as described above can be fabricated by a very simple process.

Besides, a polarizing plate may be provided on a display surface (surface on which an image is observed) of the light emitting device shown in this embodiment. This polarizing plate suppresses reflection of light incident from the outside, and has an effect of preventing an observer from being reflected on the display surface. In general, a circular polarization plate is used. However, in order to prevent light emitted from the EL layer from being returned to the inside through reflection by the polarizing plate, it is desirable to make a structure have low inner reflection by adjusting refractivity.

Incidentally, for the EL element included in the light emitting device of this embodiment, any of the organic compounds (organic compounds expressed by the chemical formulae (1) to (11)) of the present invention may be used. Besides, it is also possible to combine this embodiment with the structure of the embodiment 6.

(Embodiment 9)

In this embodiment, there is a description of an example in which a printed wiring board is provided with the light emitting device shown in the embodiment 8 to form a module.

Figure 8A:
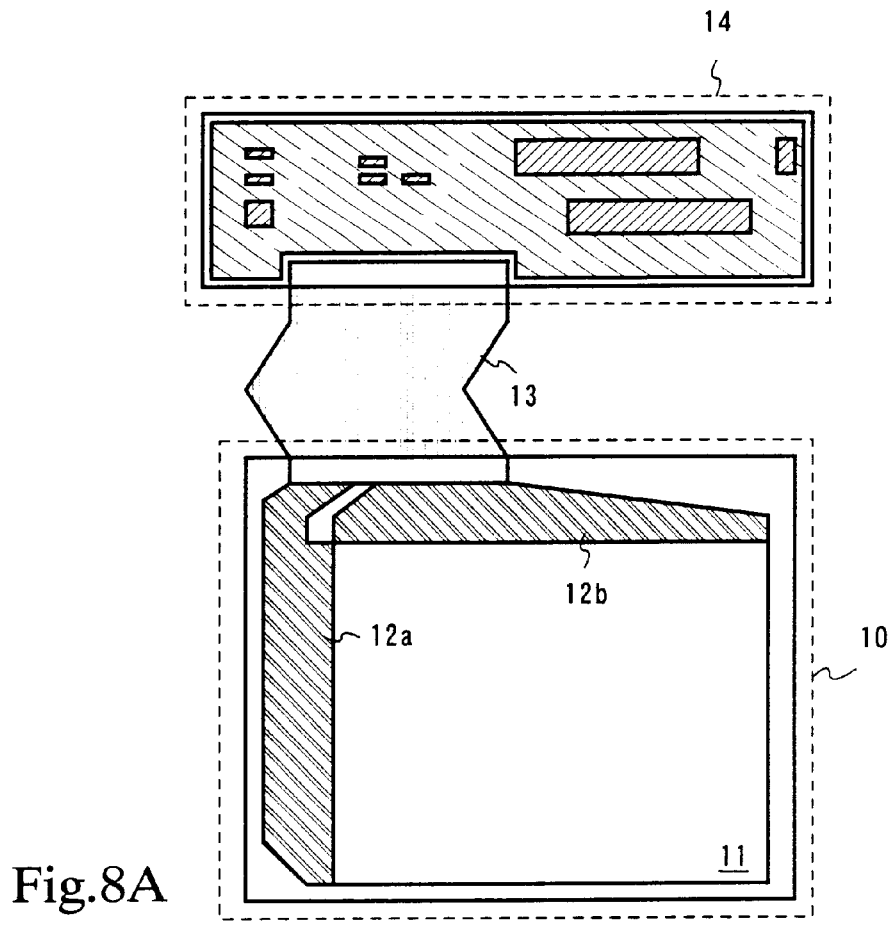
FIGS. 8A and 8B are views showing a structure of a light emitting device.

In a module shown in FIG. 8A, a TAB tape 13 is attached to a substrate 10 (including a pixel portion 11 and wiring lines 12a and 12b) over which an EL element is formed, and a printed wiring board 14 is attached through the TAB tape 13. Here, FIG. 8B is a functional block diagram of the printed wiring board 14.

Figure 8B:
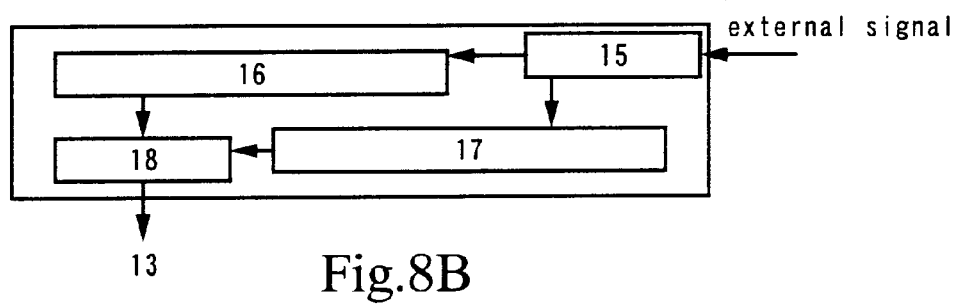

As shown in FIG. 8B, at least I/O ports (also called input or output portion) 15 and 18 and an IC functioning as a data signal side driving circuit 16 and a gate signal side driving circuit 17 are provided inside the printed wiring board 14.

The module with the structure, in which the TAB tape is attached to the substrate which has the substrate surface on which the pixel portion is formed and the printed wiring board which has a function as a driving circuit is attached through the TAB tape, is especially called a module with an external driving circuit in the present specification.

Incidentally, as the EL element included in the light emitting device of this embodiment, any of the organic compounds (organic compounds expressed by the chemical formulae (1) to (11)) of the present invention may be used. Besides, it is also possible to combine it with the structure of the embodiment 6.

(Embodiment 10)

In this embodiment, a description of an example in which a printed wiring board is provided with the light emitting device shown in the embodiment 7 or the embodiment 8 to form a module.

Figure 9A:
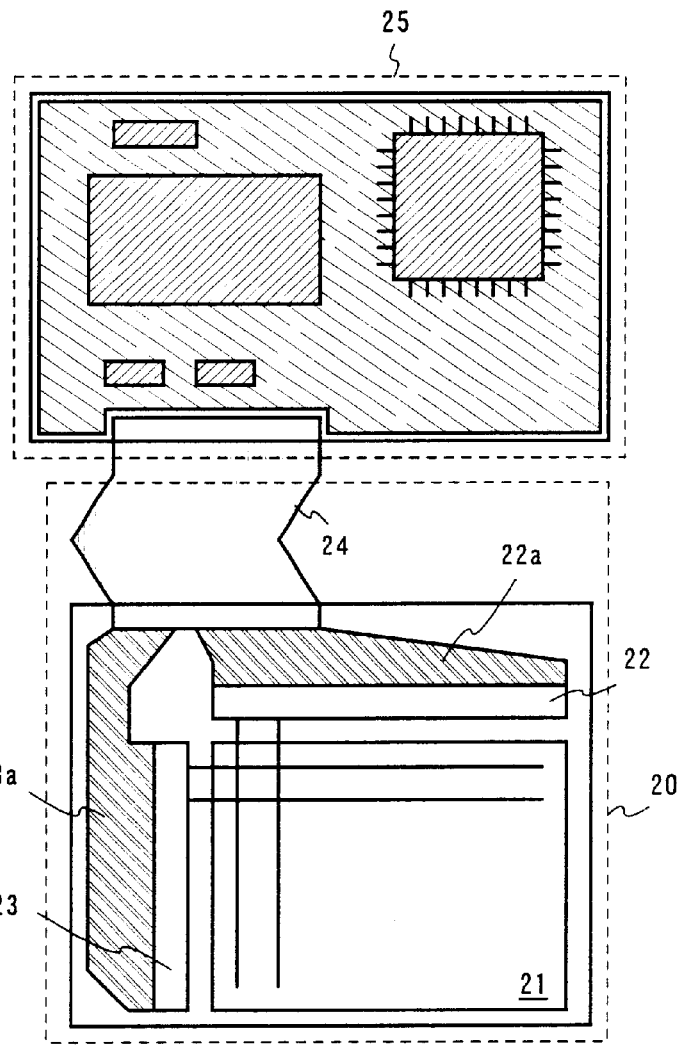
FIGS. 9A and 9B are views showing a structure of a light emitting device.

In a module shown in FIG. 9A, a TAB tape 24 is attached to a substrate 20 (including a pixel portion 21, a data signal side driving circuit 22, a gate signal side driving circuit 23, and wiring lines 22a and 23a) over which an EL element is formed, and a printed wiring plate 25 is attached through the TAB tape 24. Here, FIG. 9B is a functional block diagram of the printed wiring board 25.

Figure 9B:
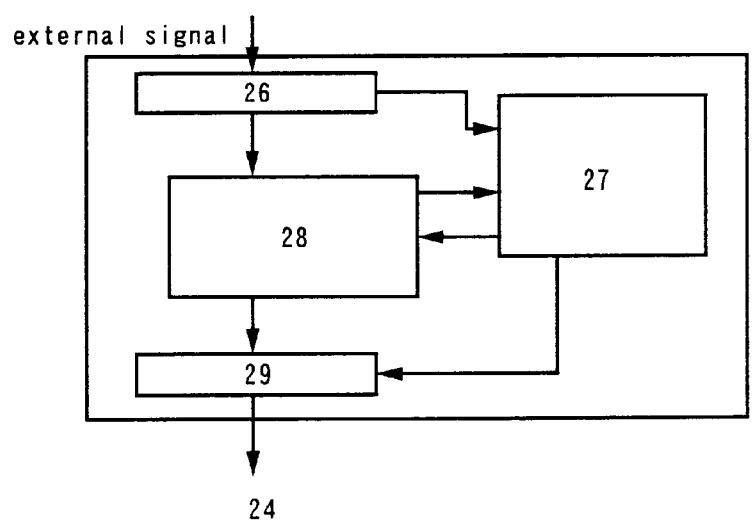

As shown in FIG. 9B, at least I/O ports 26 and 29, and an IC functioning as a control portion 27 are provided inside the printed wiring board 25. Incidentally, although a memory portion 28 is provided here, it is not necessarily required. Besides, the control portion 27 is a portion which has a function to control management of a driving circuit, correction of picture data, and the like.

The module of the structure, in which the printed wiring board with the function as a controller is attached to the substrate over which the EL element is formed, is especially called a module with an external controller in the present specification.

Incidentally, as the EL element included in the light emitting device of this embodiment, any of the organic compounds (organic compounds expressed by the chemical formulae (1) to (11)) of the present invention may be used. Besides, it is also possible to combine it with the structure of the embodiment 6.

(Embodiment 11)

Since the light emitting device of the present invention has advantages that it is bright and has low electric power consumption and high reliability, it can be used as a light source for various electronic equipments.

Typically, the device can be employed as a light source used as a back light or a front light of a liquid crystal display device, or as a light source of an illuminating equipment.

Whichever organic compounds of the present invention (organic compounds represented by chemical formulae 1 to 11) can be used as an EL element including the light emitting device of the present invention. Incidentally, th is embodiment mode of the present invention can be carried out in combination with any structure of Embodiment 6.

(Embodiment 12)

The light emitting display device of this invention has a superior visibility in a bright location in comparison with a liquid crystal display device since it is a self light emitting type, and also has a wide angle of view. Therefore it can be used as a display portion of various electronic equipment.

The following can be given as electronic equipment of the present invention: a video camera; a digital camera; a goggle type display (head mounted display); a navigation system; an audio device; a notebook type personal computer; a game apparatus; a wireless portable information terminal (such as a mobile computer, a cellular phone, a portable game machine, or an electronic book); and an image playback device equipped with a recording medium. Specific examples of those electronic devices are shown in FIGS. 10A to 11B.

Figure 10A:
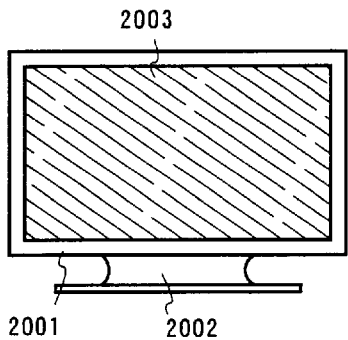
FIGS. 10A to 10F are views showing specific examples of electric instruments.

FIG. 10A is an EL display, and includes a frame 2001, a support stand 2002, and a display portion 2003. The light emitting device of the present invention can be used in the display portion 2003. The EL display is a self-light-emitting type, and therefore a back light is not necessary, and the display portion can be made thinner than that of a liquid crystal display device.

Figure 10B:
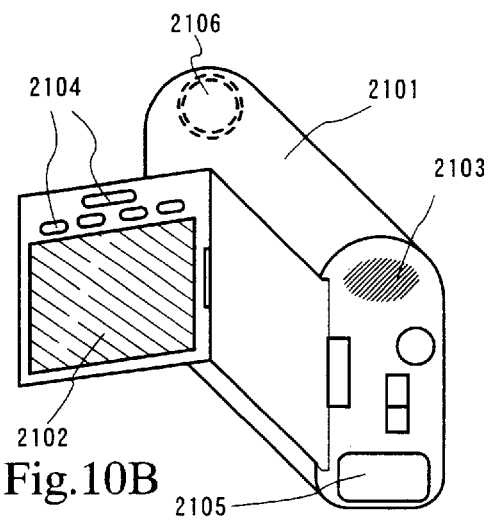

FIG. 10B is a video camera, and includes a main body 2101, a display portion 2102, a sound input portion 2103, operation switches 2104, a battery 2105, and an image receiving portion 2106. The light emitting device of the present invention can be used in the display portion 2102.

Figure 10C:
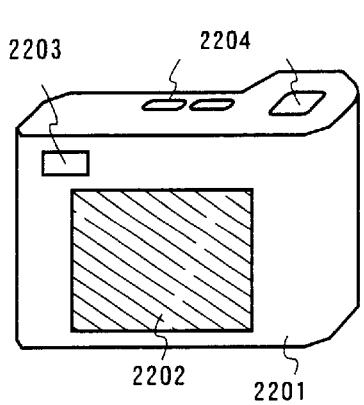

FIG. 10C is a digital camera and includes a main body 2201, a display portion 2202, an optical system 2203, an operating switch 2204. The light emitting device of the present invention can be used in the display portion 2202.

Figure 10D:
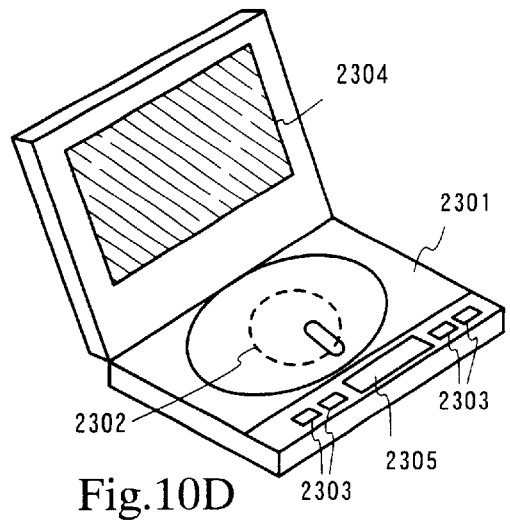

FIG. 10D is an image playback device equipped with a recording medium, and includes a main body 2301, a recording medium (such as a CD, LD or DVD) 2302, operation switches 2303, a display portion (a) 2304, and a display portion (b) 2305, etc. The display portion (a) is mainly used for displaying image information, ;and the display portion (b) is mainly used for displaying character information, and the light emitting device of the present invention can be used in the display portion (a) and for the display portion (b). Note that, the image playback device equipped with the recording medium includes devices such as CD playback devices and game machines.

Figure 10E:
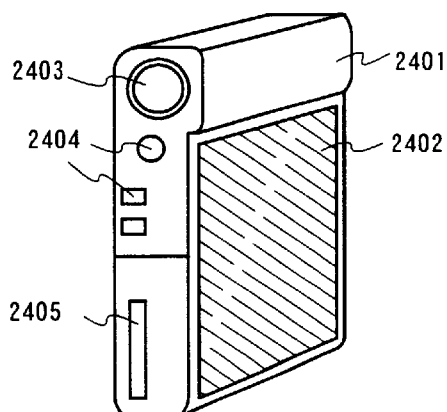

FIG. 10E is a portable (mobile) computer, and includes a main body 2401, a display portion 2402, an image receiving portion 2403, operation switches 2404, and a memory slot 2405. The electronic optical device of the present invention can be used in the display portion 2402. This portable computer records information onto the recording medium accumulated with flash memory or non-volatile memory and can play back such recordings.

Figure 10F:
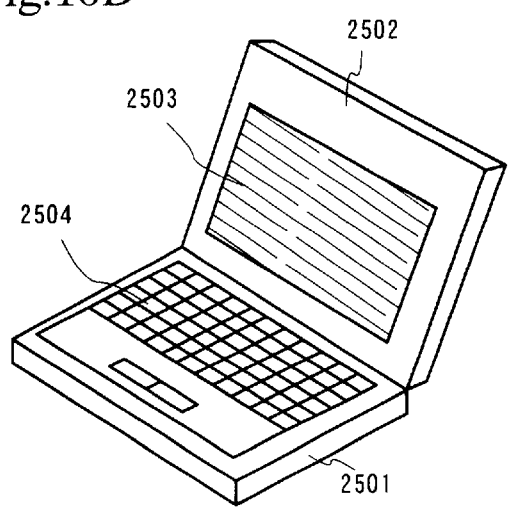

FIG. 10F is a personal computer, and includes a main body 2501, a frame 2502, a display portion 2503, and a keyboard 2504. The light emitting device of the present invention can be used in the display portion 2503.

Note that, if the brightness of light emitted by EL materials increases in the future, then it will become possible to use in a front type or a rear type projector to expand and project light containing output image information with a lens or the like.

Further, the above electronic appliances often display information distributed through an electronic communication network such as the Internet and a CATV (cable television) and radio communication such as a radio wave. In particular, there are more and more opportunities where the electronic appliances display dynamic image information. Since the response speed of an EL material is very high, a light emitting device is suitable for dynamic image display.

In addition, since the light emitting device consumes power in the light emitting portion, it is therefore preferable to use the light emitting device for displaying information so as to make the light emitting portions as few as possible. Consequently, when using the light emitting device in a display portion mainly for character information, such as in a portable information terminal, in particular a cellular phone or a car audio system, it is preferable to drive so as to form character information by the light emitting portions while non-light emitting portions are set as background.

Figure 11A:
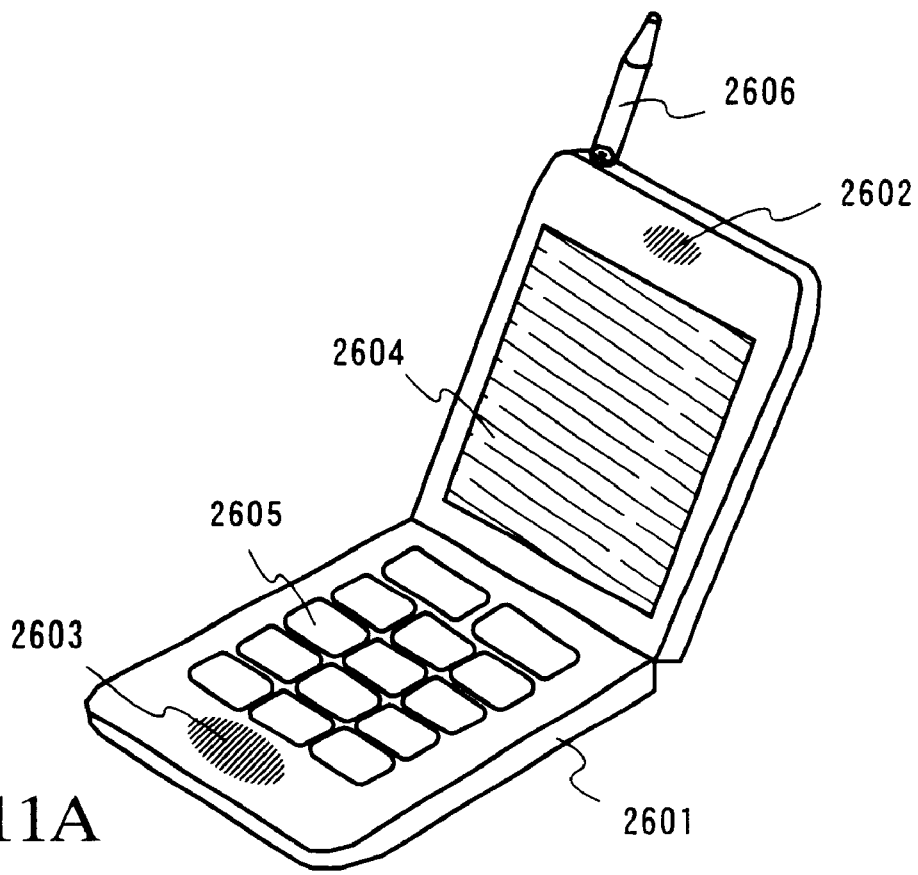
FIGS. 11A and 11B are views showing specific examples of electric instruments.

FIG. 11A is a cellular phone, and includes a main body 2601, a sound output portion 2602, a sound input portion 2603, a display portion 2604, operation switches 2605, and an antenna 2606. The light emitting device of the present invention can be used in the display portion 2604. Note that by displaying white color characters in a black color background, the display portion 2604 can suppress the power consumption of the cellular phone.

Figure 11B:
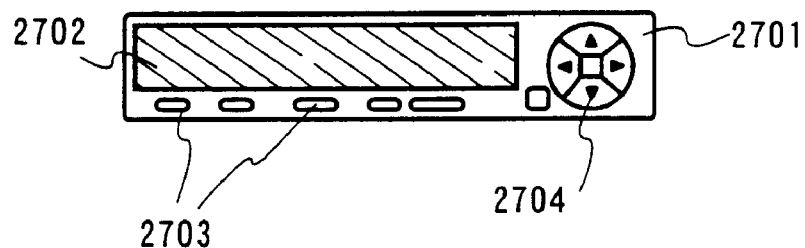

FIG. 11B is an audio playback device, (specifically a car audio system), and includes a main body 2701, a display portion 2702, and operation switches 2703 and 2704. The light emitting device of the present invention can be used in the display portion 2702. Further, a car audio system is shown in this embodiment, but the light emitting device of the present invention can be used in a household audio playback system, too. Note that by displaying white color characters in a black color background, the display portion 2704 can suppress the power consumption.

Further, it is effective to incorporate the light sensor, to provide means to detect the brightness of the environment to be used, in order for it to function to modulate the luminous brightness according to the brightness of the environment to be used. If the user may maintain the brightness with a brightness of a contrast ratio of 100 to 150 compared to the brightness of the used environment, there is no problem in recognizing the image or the character information. That is, when the environment to be used is bright, the brightness of the image is increased so it is easy to see, and when the environment to be used is dark, the brightness of the image may be suppressed to thereby suppress the power consumption.

Note that, the electronic apparatus of this embodiment may use any light emitting device including any structure of Embodiments 7 to 10. Further in the case that all of the display portion of the electronic apparatuses shown in this embodiment are the liquid crystal display, the light emitting device of the present invention can be used as a back light or a front light of the liquid crystal display.

By carrying out the present invention, a light emitting device which emits bright light and has low power consumption can be obtained at a low cost. Further, by using such a light emitting device as a light source or a display portion, an electric instrument comprising a bright display portion and low power consumption can be obtained at a low cost.

[Chemical Formula 1]

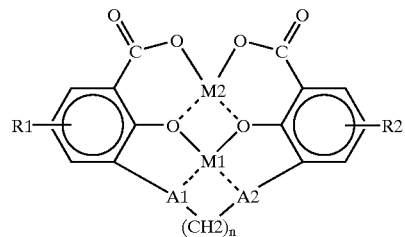
(1)

[Chemical Formula 2]

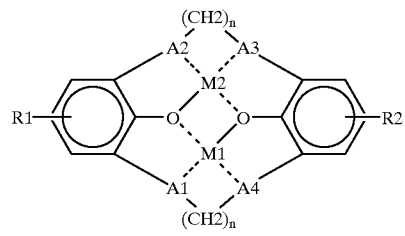
(2)

[Chemical Formula 3]

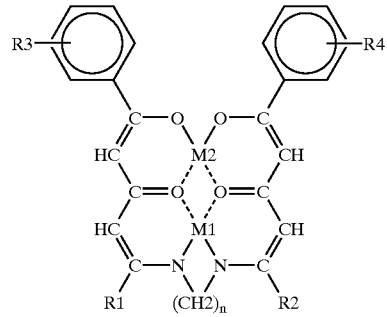
(3)

[Chemical Formula 4]

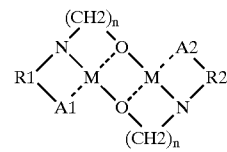
(4)

[Chemical Formula 5]

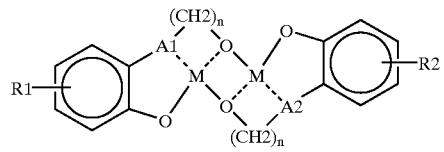
(5)

[Chemical Formula 6]

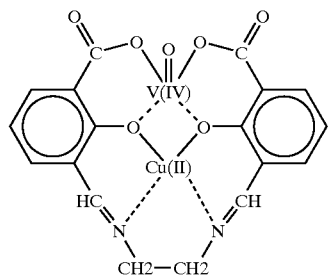
(6)

[Chemical Formula 7] (7)

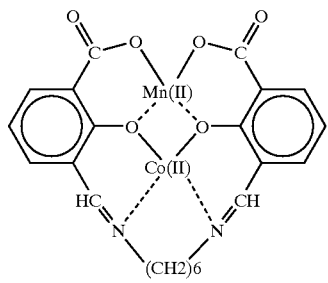

[Chemical Formula 8] (8)

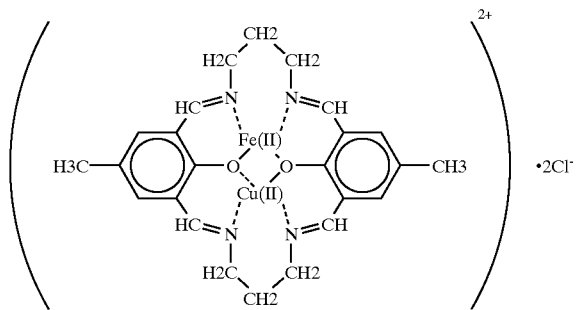

[Chemical Formula 9] (9)

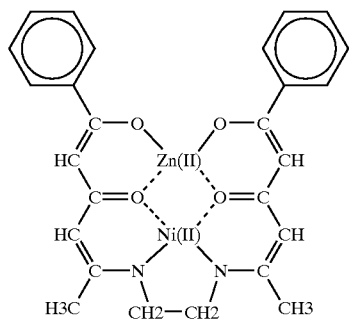

[Chemical Formula 10] (10)

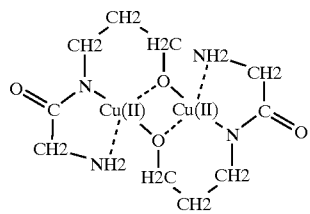

[Chemical Formula 11] (11)

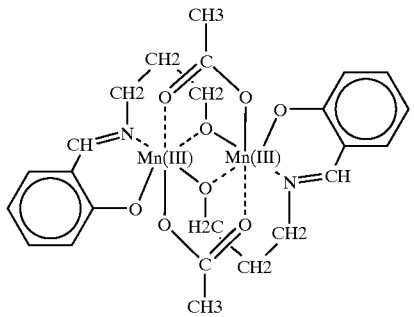

What is claimed is:

1. A light emitting device comprising an EL element, wherein the EL element comprises a thin film of an organic compound with a structure expressed by a following chemical formula,

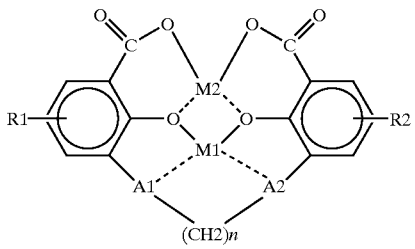

where, R1 and R2 designate hydrogen atoms, alkyl groups, or substituents containing benzene nuclei and are different or the same as each other, A1 and A2 designate chain substituents containing nitrogen, oxygen, carbon or sulfur, or heterocyclic groups containing hereto atoms and are different or the same as each other, M1 and M2 designate transition elements and are different or the same as each other, and n is an integer of n=2 or more.

2. An electric instrument using a light emitting device according to claim 1.

* * * * *